United States Patent
Wang et al.

(10) Patent No.: US 7,220,310 B2
(45) Date of Patent: May 22, 2007

(54) NANOSCALE JUNCTION ARRAYS AND METHODS FOR MAKING SAME

(75) Inventors: Zhong L. Wang, Marietta, GA (US); Pu X. Gao, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 571 days.

(21) Appl. No.: 10/726,016

(22) Filed: Dec. 2, 2003

(65) Prior Publication Data

US 2006/0254501 A1 Nov. 16, 2006

Related U.S. Application Data

(60) Continuation-in-part of application No. 10/211,696, filed on Aug. 2, 2002, now Pat. No. 6,918,959, which is a division of application No. 10/042,868, filed on Jan. 8, 2002, now Pat. No. 6,586,095.

(60) Provisional application No. 60/430,619, filed on Dec. 2, 2002.

(51) Int. Cl.
*C30B 25/12* (2006.01)

(52) U.S. Cl. .......................... 117/68; 438/497; 977/762; 977/789

(58) Field of Classification Search ................. 117/68; 438/497; 977/762, 789
See application file for complete search history.

(56) References Cited

OTHER PUBLICATIONS

Gautam, et al, "Controlled synthesis of crystalline tellurium nanorods, nanowires, nanobelts and related structures by a self-seeding solution", Journal or Materials Chemistry(2004), 14(16), pp. 2530-2535 (Abstract only).*

* cited by examiner

*Primary Examiner*—Felisa Hiteshew
(74) *Attorney, Agent, or Firm*—Bockhop & Associates, LLC; Bryan W. Bockhop (57) ABSTRACT

A nanoscale junction array includes an elongated nanowire and a plurality of elongated nanobelts. Each nanobelt has a proximal end and an opposite distal end. The proximal end of each nanobelt is attached to a different location on the nanowire. Each nanobelt extends radially away from the nanowire. A type of nanoscale junction array, a nanopropeller, includes an elongated nanowire and a plurality of elongated nanoblades. The nanoscale junction array is formed from Zinc Oxide using a metal vaporization process.

19 Claims, 6 Drawing Sheets

NANOSCALE JUNCTION ARRAYS AND METHODS FOR MAKING SAME

CROSS-REFERENCE TO A RELATED PATENT APPLICATION

The present application is a Continuation-in-Part of U.S. patent application Ser. No. 10/211,696, filed Aug. 2, 2002 now U.S. Pat. No. 6,918,959, entitled "Semiconductive Oxide Nanobelts," which is a divisional of application Ser. No. 10/042,868 filed Jan. 8, 2002, now U.S. Pat. No. 6,586,095, issued on Jul. 1, 2003. This application claims priority on both U.S. patent application Ser. No. 10/211,696 and U.S. Pat. No. 6,586,095, the entirety of both of these documents are incorporated herein by reference into the disclosure of the present application.

CROSS-REFERENCE TO A RELATED PROVISIONAL PATENT APPLICATION

The present application claims priority on U.S. Provisional Patent Application Ser. No. 60/430,619, filed Dec. 2, 2002, the entirety of which is incorporated herein by reference.

STATEMENT REGARDING GOVERNMENT RIGHTS

This invention was made with Government support under Contract No. DMR-9733160, awarded by the National Science Foundation, and the United States Government therefore has certain rights in the invention.

BACKGROUND OF THE INVENTION

1. Field of the Invention

The invention relates to nanotechnology-based devices and, more specifically, to nanobelts, nanorods, nanopropellers and devices made therefrom.

2. Description of the Related Art

Binary semiconducting oxides often have distinctive properties and can be used as transparent conducting oxide (TCO) materials and gas sensors. Current studies of semiconducting oxides have been focused on two-dimensional films and zero-dimensional nanoparticles. For example, fluorine-doped tin oxide films are used in architectural glass applications because of their low emissivity for thermal infrared heat. Tin-doped indium oxide (ITO) films can be used for flat panel displays (FPDs) due to their high electrical conductivity and high optical transparency; and zinc oxide can be used as an alternative material for ITO because of its lower cost and easier etchability. Tin oxide nanoparticles can be used as sensor materials for detecting leakage of several inflammable gases owing to their high sensitivity to low gas concentrations.

In contrast, investigations of wire-like semiconducting oxide nano structures can be difficult due to the unavailability of nanowire structures. Wire-like nano structures have attracted extensive interest over the past decade due to their great potential for addressing some basic issues about dimensionality and space confined transport phenomena as well as related applications. In geometrical structures, these nanostructures can be classified into two main groups: hollow nanotubes and solid nanowires, which have a common characteristic of cylindrical symmetric cross-sections. Besides nanotubes, many other wire-like nanomaterials, such as carbides, nitrides, compound semiconductors, element semiconductors, and oxide nanowires have been successfully fabricated.

However, the nanostructures discussed above can have a variety of deficiencies. For example, often it is difficult to control the structure and morphology of many nanostructures. Further, many nanostructures are not defect and/or dislocation free. These deficiencies can cause problems such as, for example, uncontrolled properties due to uncontrolled structure and morphology, scattering from dislocations in electric transport applications, and degraded optical properties.

Semiconducting oxides, as an important series of materials candidates for optoelectronic devices and sensors, have attracted considerable attention in scientific research and technological applications. Recently, quasi-one-dimensional nanostructures for the functional materials have been successfully fabricated by using various approaches including thermal evaporation, sol-gel, arc discharge, laser ablation and template-based method. To date, extensive research work has been focused on ZnO, which is one of the most useful oxides for optical and sensor applications. Many different morphological ZnO nanostructures, including wires, belts, and rods, etc., have been fabricated.

In ZnO, a combination of the three types of fast growth directions ($[2\bar{1}\bar{1}0]$, $[01\bar{1}0]$, and $[0001]$) and the three area-adjustable facets $[2\bar{1}\bar{1}0]$, $[01\bar{1}0]$, and $[0001]$) of ZnO has resulted in a diverse group of hierarchical and intricate nanostructures. In addition to non-central symmetry, the semiconducting and piezoelectric as well as surface polarization characteristics of ZnO make it one of the most exciting oxide nanostructures for investigating nano-scale physical and chemical properties. Structural configurations such as piezoelectric nanobelts, nanosprings, and nanorings, etc., are known.

Cantilever based scanning probe microscopy (SPM) techniques are among the most powerful approaches for imaging, manipulating and measuring nanoscaled properties and phenomena. SPM's generate images by measuring forces between sample surfaces and microscope probes. Common forces detected using SPM's are the van der Waals force, electrostatic force, capillary force, and double-layer force. Conventional SPM cantilevers are fabricated from silicon, SiC and $Si_3N_4$ using e-beam or optical lithography. A typical SPM cantilever has a length, width, and thickness of about 125 µm, about 35 µm, and about 4 µm respectively. The resolution of an SPM is limited by three factors; 1) the shape of the tip, 2) the sample-tip contact, and 3) the ability to measure the sample-tip interaction.

Ideally an SPM probe would be a robust one-dimensional structure, while the cantilever would poses ultra-high sensitivity to any and all forces. Atomic force microscope tips have been developed by growing carbon nanotubes on the ends of standard AFM probes. These high aspect ratio tips are nearly ideal for AFM imaging because of their size and durability. As a result, the nanotubes can image surfaces with a large degree of abrupt variation in surface morphology. Geometrically small single crystal silicon cantilevers are being developed in an attempt to measure the electronic spin of materials. The capabilities of nanotube tips will not be fully exploited until the cantilever is sensitive to all nanotube-surface interactions, nor can imaging of electronic spin occur until measurements of forces in the sub-atom Newton range become a reality.

Numerous applications will require controlled movement of fluids at the nano scale. For example, some proposed lab-on-a-chip designs will need to be able to monitor fluid flow, induce movement and mix fluids at the nano scale.

Therefore, there is a need for defect and dislocation free nano structures.

There is also a need for a method of sensing and inducing fluid flow at the nano scale.

SUMMARY OF THE INVENTION

The disadvantages of the prior art are overcome by the present invention, which, in one aspect, is a nanoscale junction array that includes an elongated nanowire and a plurality of elongated nanobelts. Each nanobelt has a proximal end and an opposite distal end. The proximal end of each nanobelt is attached to a different location on the nanowire. Each nanobelt extends radially away from the nanowire.

In another aspect, the invention is a nanopropeller that includes an elongated nanowire and a plurality of elongated nanoblades. The elongated nanowire has an elongated orientation. Each of the plurality of elongated nanoblades has a proximal end and an opposite distal end with the proximal end of each nanobelt being attached to a different location on the nanowire. Each nanoblade extends radially away from the nanowire and has an elongated dimension terminated by the proximal end and the distal end with an elongated length between the proximal end and the distal end. Each nanoblade also has a width dimension that is transverse to the elongated dimension and is also transverse to the elongated orientation of the elongated nanowire. The width dimension has a length that is less than the elongated length. Each nanoblade also has a depth dimension that has a length that is less than the length of the width dimension.

In yet another aspect, the invention is a method of making a nanoscale junction array in which a metal oxide and an oxide of a catalyst are placed at a first location in a gas-controlled furnace. A substrate is placed at a second location, spaced apart from the first location, in the gas-controlled furnace. The gas-controlled furnace is evacuated to a first predetermined pressure. For a first predetermined period of time, the following steps are executed: (1) The metal oxide and the catalyst are heated to a first predetermined temperature after the evacuating step. The first predetermined temperature sufficient to cause a metal vapor to boil off from the metal oxide. (2) A carrier gas is applied to the metal oxide and the catalyst at a predetermined flow rate. (3) The second location is maintained at a second predetermined temperature, less that the first predetermined temperature, thereby causing relatively rapid growth of a metal oxide nanowire between condensed particles of the catalyst and the substrate. After the first predetermined period of time, the following steps are executed for a second predetermined period of time: (1) The metal oxide and the catalyst are heated to a third predetermined temperature, different from the first predetermined temperature. The third predetermined temperature is sufficient to cause a metal vapor to boil off from the metal oxide. (2) The carrier gas is applied to the metal oxide and the catalyst at a predetermined flow rate. (3) The second location is maintained at a fourth predetermined temperature, less that the third predetermined temperature, thereby causing relatively slow growth of a plurality of metal oxide nanobelts between condensed particles of the catalyst and the nanowire. The nanobelts and the nanowire form the nanoscale junction array.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Unless otherwise specified herein, the drawings are not necessarily drawn to scale.

Figure 1A:
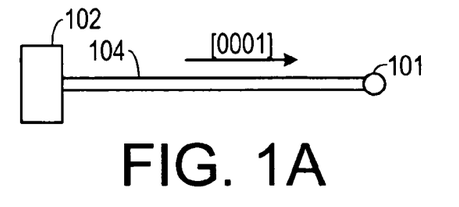
FIG. 1A is a side view schematic projection showing initial accretion of an oxide nanowire.
Figure 1B:
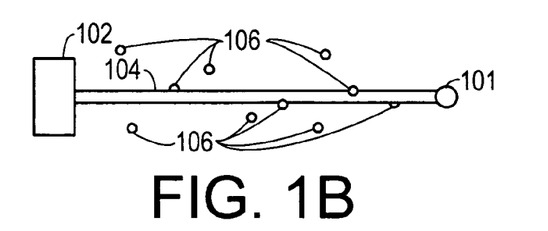
FIG. 1B is a side view schematic projection showing condensation of catalyst droplets onto the nanowire.
Figure 1C:
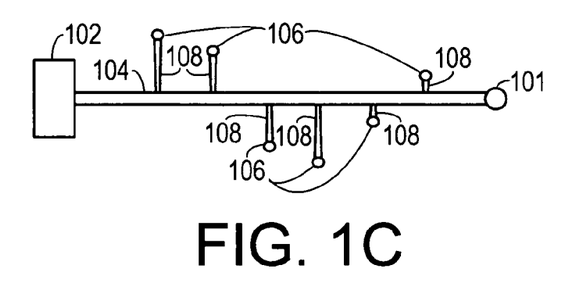
FIG. 1C is a side view schematic projection showing initial growth of nanobelts on the surface of the nanowire.
Figure 1D:
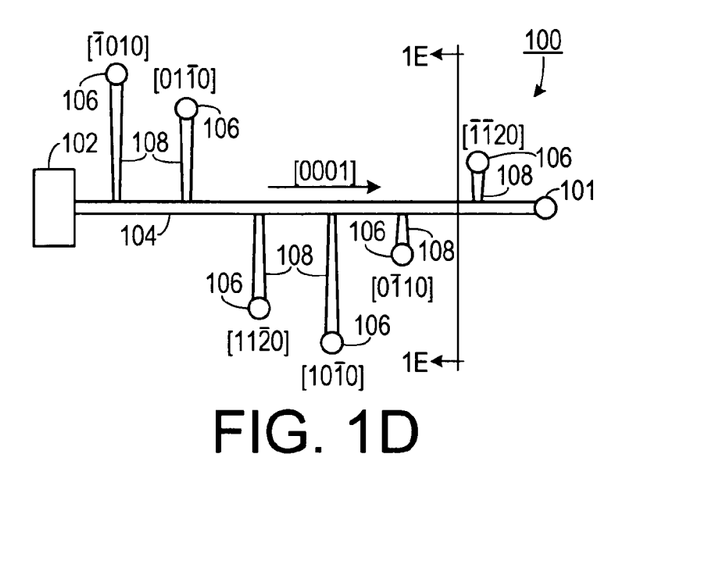
FIG. 1D is a side view schematic projection showing mature nanobelts grown from the surface of the nanowire.
Figure 1E:
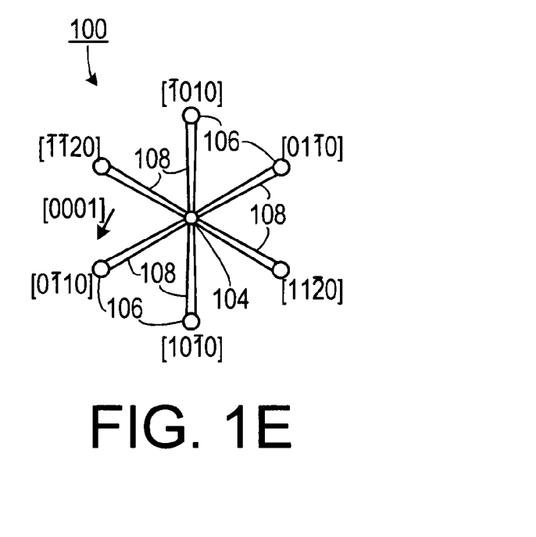
FIG. 1E is a front view cross-sectional drawing taken along line 1E—1E in FIG. 1D.

As shown in FIGS. 1A and 1E, one embodiment of the invention is a nanoscale junction array 100 that includes an elongated nanowire 104 and a plurality of elongated nanobelts 108, each extending radially away from the nanowire 104. In one embodiment, the elongated nanowire 104 and the plurality of elongated nanobelts 108 form a single crystal as a wurtzite hexagonal structure. When using the Miller index convention of crystallography, if the elongated nanowire 104 is placed along the [0001] axis of a hexagonal coordinate scheme, then each of the plurality of elongated nanobelts 108 will have a symmetric orientation. For example the orientations of the nanobelts 108, in one embodiment, could have the following indices: ±[$\bar{1}$010], ±[0$\bar{1}$10], or ±[$\bar{1}\bar{1}$20], in another embodiment they could have the following indices: ±[2$\bar{1}\bar{1}$0], ±[11$\bar{2}$0], or ±[1$\bar{2}$10].

Each nanobelt 108 terminates in a metal particle 106 that is used as a catalyst for accretion of the nanobelt 108. The metal particle 106 may be optionally removed for certain applications (e.g., field emitter and biological/medical), or may be retained for certain applications (e.g., where welding the nanobelt to a metal is desired). Removal of the metal particle 106 may be accomplished by heating the nanoscale junction array 100 to a temperature that melts the metal of the metal particle 106 and then shaking the nanoscale junction array 100 or subjecting it to a relatively high flow rate of a gas. Removal of the metal particle 106 may also be accomplished by applying a chemical solvent (e.g., an acid) to the nanoscale junction array 100.

In one embodiment, both the nanowire 104 and the nanobelts 108 comprise zinc oxide (ZnO) and the metal catalyst particle comprises tin (Sn). The nanowire may be grown from an alumina ($Al_2O_3$) substrate 102. In the embodiment shown in FIGS. 1A–1E, the proximal end of each nanobelt 108 has a width of less than 100 nm and the distal end of each nanobelt 108 has a width in a range between 100 nm to 300 nm.

Figure 2:
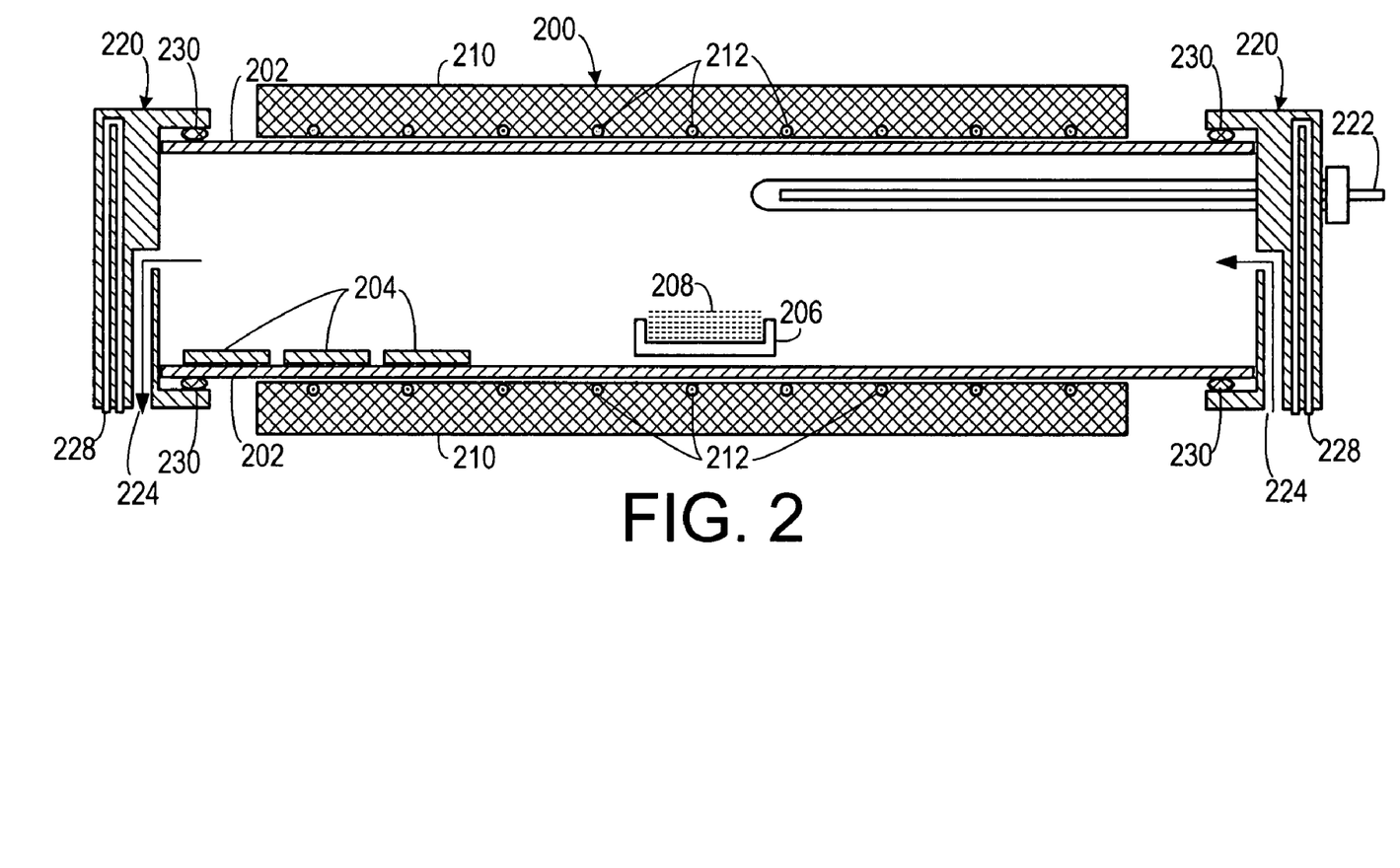
FIG. 2 is a side view of one example of a mechanism used to make nanobelts, nanowires and nanopropellers according to one embodiment of the invention.
Figure 3A:
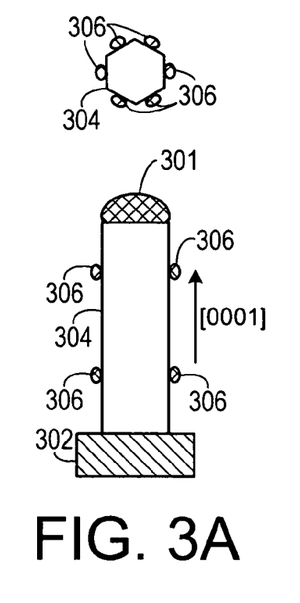
FIG. 3A is a side view showing condensation of initial accretion of an oxide nanowire as part of a nanopropeller and condensation of catalyst droplets onto the nanowire, along with a corresponding top view.
Figure 3B:
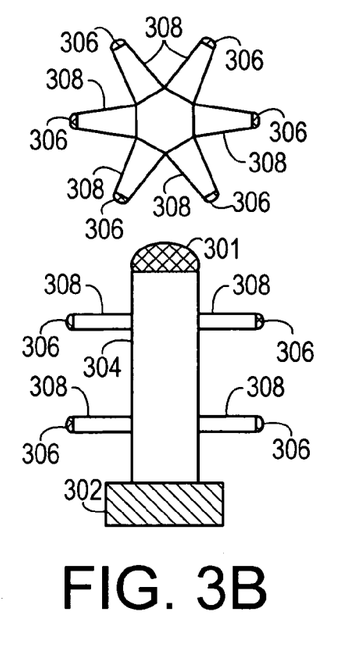
FIG. 3B is a side view showing initial growth of nanobelts as part of a nanopropeller on the surface of the nanowire, along with a corresponding top view.
Figure 3C:
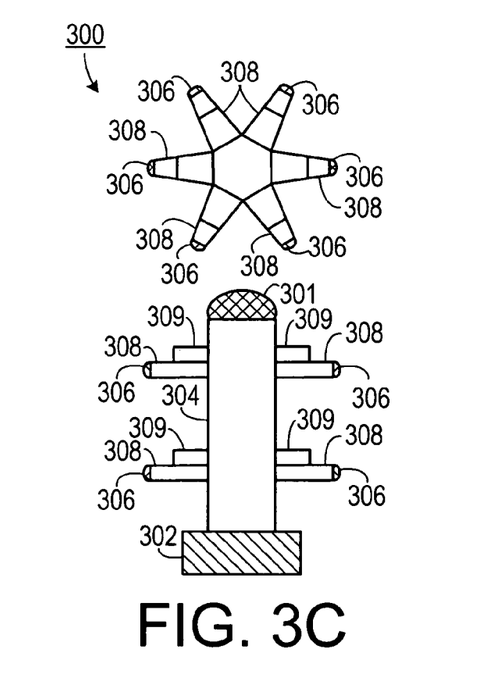
FIG. 3C is a side view showing growth of secondary nanobelt layers, along with a corresponding top view.
Figure 3D:
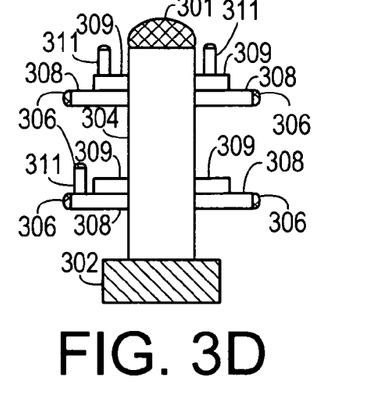
FIG. 3D is a side view showing growth of secondary nanowires.

One apparatus for making a nanoscale junction array 100 is shown in FIG. 2. The apparatus includes a gas-controlled tube furnace 200. The tube furnace 200 includes an alumina tube 202 that is surrounded by a insulating cuff 210 with heating elements 212 embedded therein. An alumina boat 206 is placed at a first location in the alumina tube 212. A powder 208 comprising an oxide powder and a catalyst oxide powder is placed in the alumina boat 206. In one embodiment, the ration of catalyst oxide to metal oxide is 1:1 (e.g., $ZnO:SnO_2$=1:1). One or more alumina substrates 204 is placed at a second location, spaced apart and downstream from the alumina boat 206, in the alumina tube 212. End units 220 are coupled to the alumina tube 202 via O-rings 230. Each end unit 220 includes a passage 224 that allows for either the inflow or outflow of a carrier gas. The end units 220 also include a water cooling loop 228 that allows for the control of the temperature of the end unit 220 and the temperature gradient of the alumina tube 202. One tube furnace 200 that is suitable for making small quantities of nanoscale junction arrays is the Thermolyne 79300 Tube Furnace. The metal oxide may comprise zinc oxide (for making zinc oxide nanowires and nanobelts) and the catalyst oxide could comprise tin oxide.

The nanoscale junction array is grown using a vapor-liquid-solid (VLS) process. Initially, the gas-controlled furnace 200 is evacuated to a first predetermined pressure (such as $2\times10^{-3}$ Torr). Once metal evaporation occurs, the pressure inside the alumina tube 202 is maintained at a higher lever (e.g., between 300 Torr to 400 Torr). For a first period of time (e.g., 60 minutes), the metal oxide and the catalyst are heated to a relatively high temperature (e.g., 1300° C.) to induce metal evaporation. The temperature during the first period of time must be sufficient to cause metal vapor to boil off from the metal oxides. During evaporation, a carrier gas (such as argon in a first embodiment, or nitrogen in a second embodiment) is passed through the alumina tube 202 at a predetermined flow rate (e.g., 50 sccm in the first embodiment, or 20 sccm in the second embodiment). The second location is maintained at a second predetermined temperature (e.g., 700° C. to 800° C.), which is less that the first predetermined temperature. As shown in FIG. 1A, this causes a relatively large droplet 101 of metal catalyst to condense and relatively rapid growth of the metal oxide nanowire 104 between condensed catalyst particle 101 and the substrate 204.

Once nanowires have grown sufficiently from the substrate 204. The environment is changed for a second period of time (e.g., 30 minutes). The metal oxide and the catalyst oxide are heated to a lower temperature (e.g., 1100° C.) which is still sufficient to cause a metal vapor to boil off from the metal oxide. This change in environment allows for metal catalyst droplets 106 to condense onto the nanowire 104, as shown in FIG. 1B. From these smaller metal catalyst droplets 106 grow nanobelts 108 along orientations dictated by the lattice structure of the nanowire 104, as shown in FIGS. 1C–1E.

As shown in FIGS. 3A to 3D, a nanopropeller 300 may also be made according to the invention. The nanopropeller 300 includes elongated nanowire 304, having an elongated orientation (e.g., [0001] and a plurality of elongated nanoblades 308. The elongated nanowire 304 is grown between the substrate 302 and the catalyst droplet 301, as described above, with the nanobelts 308 growing between the nanowire 304 and smaller catalyst droplets 306. However, each of plurality of elongated nanoblades 308 is transverse to the nanowire 304, thereby in a position to act as a blade. In this embodiment, the width dimension of each nanoblade is greater at the proximal end that at the distal end. In this embodiment the nanoblades 308 could have the following crystal symmetry orientations ±[2$\bar{1}\bar{1}$0], ±[11$\bar{2}$0], or ±[1$\bar{2}$10]. Secondary layers 309 may form on the nanoblades 308 and secondary nanowires 311 may also grow from the nanoblades 308.

In one method of making the nanopropeller 300 shown in FIGS. 3A–3D, the carrier gas used is nitrogen an flows at a gas flow rate of 20 sccm. Also, a reducing agent (e.g, graphite) is placed in the gas-controlled furnace (such as in the following ratio: $ZnO:SnO_2:C$=3:4:1.5). The reducing agent acts to remove the oxygen from the metal oxide of the catalyst (e.g., $SnO_2+C \rightarrow Sn+CO_2$). In one embodiment of the method, the oxide powders are initially heated to about 1100° C. and the substrate is initially maintained at a temperature of between 600° C. and 700° C. Then, during the second period of time, the oxide powders are heated to about 1300° C. and the substrate temperature is maintained at between 800° C. and 900° C.

If the structure of the nanopropeller 300 comprises monocrystalline zinc oxide, then the nanowire 304 would be piezoelectric and would generate a voltage when the nanowire 304 is twisted. This property gives rise to the devices shown in FIGS. 4A and 4B. In both of these devices, a first electrical contact 405 in electrical communication with a first location on elongated nanowire 404 and a second electrical contact 406 in electrical communication with a second location on elongated nanowire 404. The second location is spaced apart from the first location and at least one nanoblade 408 is disposed between the first location and the second location.

Figure 4A:
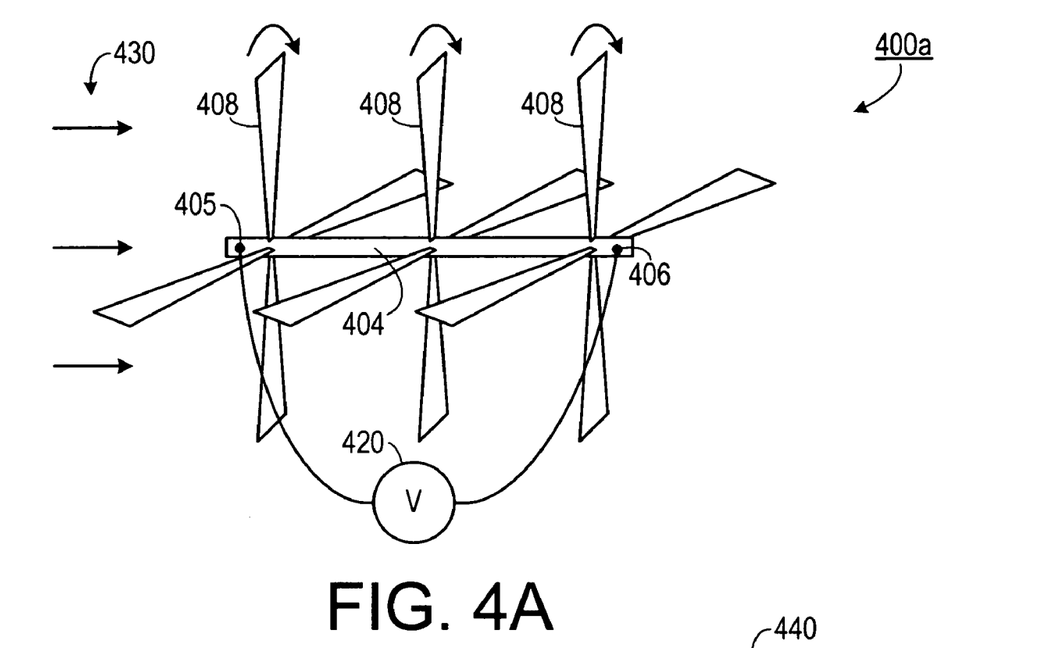
FIG. 4A is a side perspective view of a nanopropeller array fluid flow sensor.

As shown in FIG. 4A, a voltage sensing circuit 420 that senses a voltage between the first electrical contact 405 and the second electrical contact 406 indicates the amount of twist in the nanowire 404. If fluid flow 430 is impinging on the nanoblades 408 to cause the twist, then the voltage sensed by the circuit 420 indicates the rate of fluid flow.

Thus, the nanopropeller 400a may be used as a nanoscale fluid flow detector. Such a detector could be used in many applications, including a minimally intrusive in situ blood flow detector and a fluid flow monitor for a lab-on-a-chip.

Figure 4B:
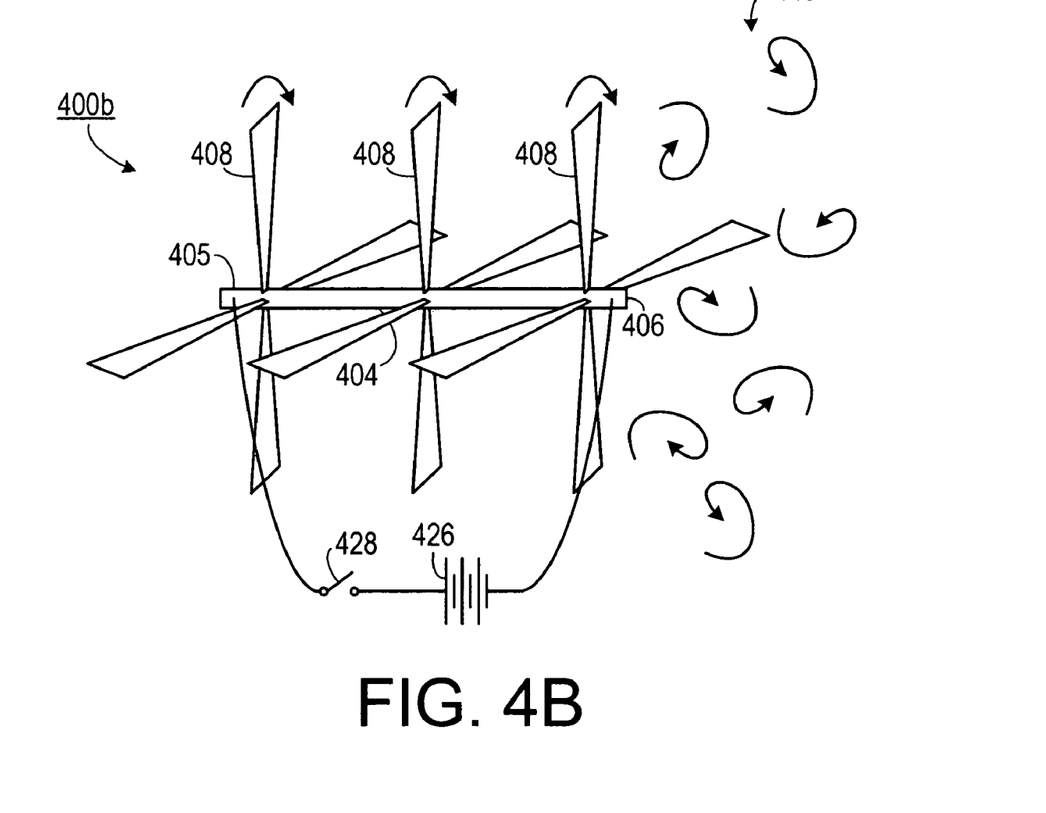
FIG. 4B is a side perspective view of a nanopropeller array fluid propeller/mixer.

As shown in FIG. 4B, a voltage could be applied to the nanopropeller 400b to induce twist in the nanowire 404. A voltage generating circuit, including a voltage source 426 and a pulse generating switch 428 could be used to apply a voltage between the first electrical contact 405 and the second electrical contact 406, thereby rotating the nanoblades 408 periodically and causing fluid flow or mixing. This could be useful to control mixing in a lab-on-a-chip.

Figure 5A:
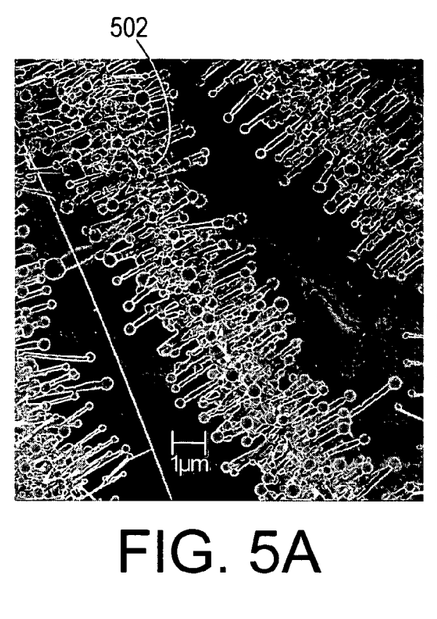
FIG. 5A is a side view micrograph of a nanobelt junction array.
Figure 5B:
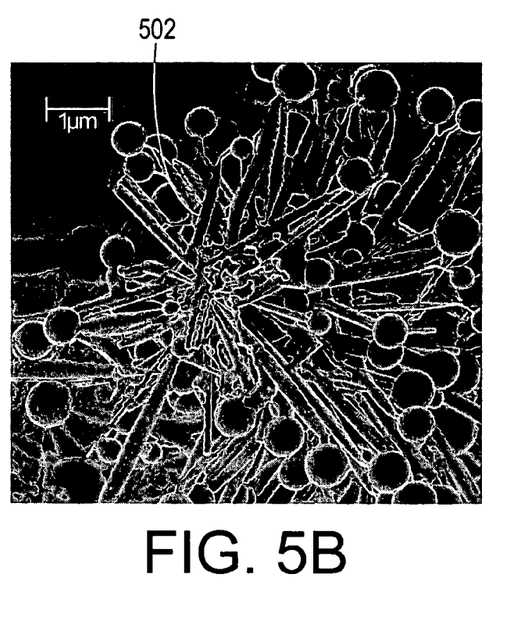
FIG. 5B is a perspective axial view micrograph of a nanobelt junction array.
Figure 5C:
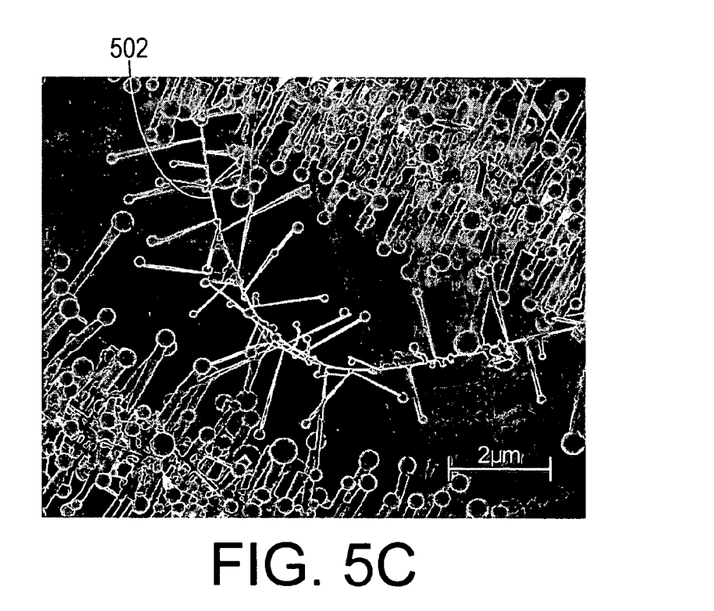
FIG. 5C is a side view micrograph of a nanobelt junction array.
Figure 6A:
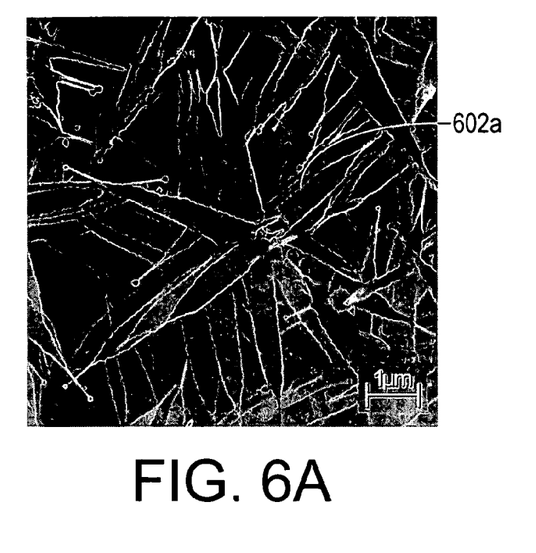
FIG. 6A is a perspective axial view micrograph of a nanopropeller array.
Figure 6B:
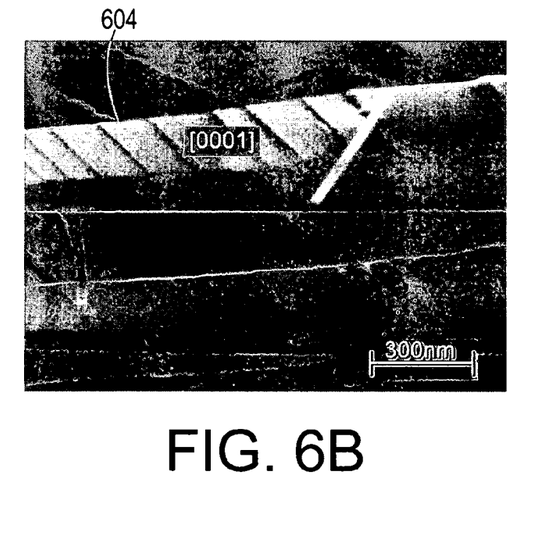
FIG. 6B is a perspective view micrograph detailing two nanobelt blades of a nanopropeller array

A micrograph of a dense nanobelt junction array 502a, according to one embodiment of the invention, is shown in FIGS. 5A and 5B. A micrograph of a less dense nanobelt junction array 502b, according to one embodiment of the invention, is shown in FIG. 5C. A micrograph of a nanopropeller 602a, according to one embodiment of the invention, is shown in FIG. 6A and a micrograph of a layered nanobelt 604 is shown in FIG. 6B.

In a first experiment employing a method according to the invention, in which self-assembled nanowire-nanoribbon junction arrays were made, thermal evaporation was used in the synthesis of ZnO nanostructures. The set-up consisted of a horizontal high temperature tube furnace of length of about 50 cm, an alumina tube (about 75 cm in length), a rotary pump system and a gas controlling system. Commercial (Alfa Aesor) ZnO and $SnO_2$ powders with weight ratio of 1:1 (5 grams in total) were fully mixed by grounding the powder mixture for 15 minutes and then used as the source material. The source material was loaded on an alumina boat and positioned at the center of the alumina tube. After evacuating the tube to $2\times10^{-3}$ Torr, thermal evaporation was conducted at 1300° C. for one hour under pressure of about 300 Torr to 400 Torr and Argon (Ar) carrier gas was applied at a flow rate of 50 sccm (standard cubic centimeters per minute). The synthesized nanostructures grew on the top of the inner-wall of the alumina tube in a region of about 4 cm in width, located downstream about 15 cm away from the source material (which was located in the middle of the furnace), and the local growth temperature was in the range of about 700° C. to 800° C.

The prepared products were characterized by high-resolution field emission scanning electron microscopy (FESEM) (LEO 1530 FEG at 5 & 10 kV), transmission electron microscopy (TEM) (JEOL 100C at 100 kV; field emission TEM Hitachi HF-2000 at 200 kV), and energy-dispersive X-ray spectroscopy (EDS) attached to the SEM and TEM, respectively.

The yield of the synthesis was reasonably high. Typical scanning electron microscopy (SEM) images of the as-synthesized products showed an image of the as-synthesized products with a uniform feature consisting of sets of central axial nanowires, surrounded by radial oriented "tadpole-like" nanobelts. (See, e.g., FIGS. 5A–C). The morphology of the string appears like a "liana," and the axial nanowire is the "rattan," which has a uniform cross-section with a dimension in the range of a few tens of a nanometer. The "tadpole-like" branches have spherical balls at the tips. EDS analysis showed that the tadpole-like structure and the central nanowire were ZnO, while the ball at the tip was Sn.

The strings, as shown in FIGS. 5A and 5B, had a dense and ordered stacking of tadpole-like nanostructures with maximum widths of about 300 nm, while the string shown in FIG. 5C was string assembled with sparsely distributed tadpole-like nanostructures along a thin nanowire. The tadpole-like structures had a ribbon shape, with a fairly uniform thickness, and their surfaces were rough with steps, as shown in FIG. 6B. The contact point between the nanoribbon with the axial nanowire was rather small in the order of a few tens of nanometers, while far away from the contacting point, the nanoribbon size was rather large in the order of about 100–200 nm. The distribution of the nanoribbons around the axial nanowire had an angle interval of about 60°. A front view of the nanowire indicates a six-fold symmetrical ordered assembly, as seen in FIG. 5B.

The axial nanowire was as thin as about 30 nm, while the width of the nanoribbon was rather large and increases as the growth continued. The contrast introduced by the surface steps on the ribbons was apparent. In one run two nanowires grew from a nanoribbon. A TEM image and a corresponding electron diffraction pattern showed that the nanoribbon and the nanowire had a wurtzite (hexagonal) structure. The most commonly observed growth direction of the nanoribbons is $[01\bar{1}0]$ (and equivalent directions), with the nanowires oriented along $[0001]$; the top surfaces of the nanoribbon had a $\pm[2\bar{1}\bar{1}0]$ orientation.

The nanowire and nanoribbons were of the same crystal piece and they shared a common $[2\bar{1}\bar{1}0]$ plane. Their growth directions were $[0001]$ and $\pm[01\bar{1}0]$, respectively. Electron diffraction, bright and dark-field TEM images recorded from the junction area proved that the nanoribbon and nanowire had the same crystal structure and orientation.

A mixture of $SnO_2$ and ZnO powders was used as the source material. It is known that $SnO_2$ can decompose into Sn and $O_2$ at high temperature, thus, the growth of the nanowire-nanoribbon junction arrays is the result of the vapor-liquid-solid (VLS) growth process, in which the Sn catalyst particles were responsible for initiating and leading the growth of ZnO nanowires and nanoribbons. One study of ZnO nanobelts showed that the fast growth directions of ZnO include $[0001]$ and $[10\bar{1}0]$.

The growth of the nano-structure according to this embodiment of the invention can be separated into two stages. The first stage is a fast growth of the ZnO axial nanowire along $[0001]$ with Sn as the catalyst. The growth rate was so high that a slow increase in the size of the Sn droplet had little influence on the diameter of the nanowire, thus the axial nanowire had a fairly uniform shape along the growth direction.

The second stage of the growth is the nucleation and epitaxial growth of the nanoribbons due to the arrival of the tiny Sn droplets onto the ZnO nanowire surface. This stage is much slower than the first stage because the lengths of the nanoribbons are uniform and much shorter than that of the nanowire. Since Sn is in a liquid state at the growth temperature, it tends to adsorb the newly arriving Sn species and grows into a larger size particle (i.e., by coalescing). Therefore, the width of the nanoribbon increased as the size of the Sn particle at the tip became larger, resulting in the formation of the tadpole-like structure Shown in FIG. 5A.

The ZnO nanowire is likely to have a hexagonal cross-section bounded by $\pm[10\bar{1}0]$, $\pm[01\bar{1}0]$ and $\pm[\bar{1}100]$, which are six crystallographic equivalent planes. The Sn liquid droplets deposited onto the ZnO nanowire lead to the simultaneous growth of the ZnO nanoribbons along the six growth directions: $\pm[10\bar{1}0]$, $\pm[0\bar{1}10]$ and $\pm[\bar{1}100]$. The angles between the two adjacent growth directions is 60°, resulting in the six-fold symmetric distribution of the nanoribbons around the nanowire, in agreement with the observation.

By thermal evaporating a mixture of ZnO and $SnO_2$, self-assembled nanowire-nanoribbon junction arrays of ZnO have been synthesized. The growth is dominated by the VLS mechanism and Sn particles reduced from $SnO_2$ serve as the catalyst for the growth. The axial nanowires (the "rattans") are the result of fast growth along [0001], and the surrounding "tadpole-like" nanoribbons are the growth along [10$\bar{1}$0]. An isotropic growth along six [$\bar{1}$0] resulted in the ordered radial distribution of the nanoribbons around the axial nanowire. The junction arrays of ZnO structures are likely to have ultra-high surface sensitivity due to the unique structure, and they are a candidate for building sensors with ultra-high sensitivity.

In a second experiment employing a method according to the invention nanopropeller arrays were created. Such structures could have applications for sensing, microfluidics, electromechnical coupled devices, and transducers.

The polar surface dominated nanopropeller arrays of ZnO were grown by a two-step high temperature solid-vapor deposition process. The experimental set-up consisted of a horizontal high temperature tube furnace of a length of about 50 cm, an alumina tube (of about 75 cm in length), a rotary pump system and a gas controlling system. Commercial (Alfa Aesor) ZnO and $SnO_2$ powders as well as graphite with molar ratio of 3:4:1.5 were mixed, ground and then loaded on an alumina boat and positioned at the center of the alumina tube. The evaporation was conducted at 1100° C. for 60 minutes (step I) and then up to 1300° C. for half an hour (step II) under a pressure of 200 mbar. Nitrogen ($N_2$) carrier gas was used at a flow rate controlled at 20 sccm. The nanopropeller arrays grew on a polycrystalline $Al_2O_3$ substrate in a temperature zone ranging of about 600° C. to 700° C. and about 800° C. to 900° C., corresponding to the steps I and II, respectively.

A top view of the well-aligned ZnO nanopropeller arrays on a polycrystalline $Al_2O_3$ substrate grown in a relatively higher temperature zone (~680° C. (step I)) is shown in FIG. 6A. Each column of nanopropeller arrays consists of six arrays of triangular shaped blades of 4–5 μm in length, and a propeller arrays of diameter roughly 10 μm. Columns of the nanopropellers remained their six-fold arrays of parallel nanoribbon blades around the central nanowire. There was a small Sn ball of a diameter of about 50 nm at the tip of the blade, which is less than half of the average width of the blade (about 400 nm). All of the blades had a uniform isosceles triangular shape. A corresponding electron diffraction pattern indicated that the blade surfaces have an orientation of ±[0001], and a growth direction of [2$\bar{1}\bar{1}$0] (along the a-axis).

Nanopropeller arrays grown in a lower temperature zone (600–650° C., step I) resulted in each column being as large as 2–5 μm in diameter. There were aligned nanowires and isosceles triangular-shape nanoblades growing perpendicularly. Fine nanowires (about 50 nm) may grow vertically on the top surface of the nanoblades. The wires are only grown on one side of the nanoblades. The nanoblades are at 60° angle, corresponding to the six-fold symmetry in the c-plane. Uniform Sn particles of 50 nm in size are located at the tip of the nanoblades, and they are eight times smaller than the largest width of the nanoblade. The smallest width of the triangular-shape nanoblade is about 20 nm and the maximum width is about 500 nm. The nanoblade has a stepped top surface towards the growth direction, while the surface against the growth direction is smooth. A closer examination at the junction between the nanoblades and the axial nanowire shows major steps.

In addition to the closely packed columns of nanopropeller arrays, freestanding nanopropeller arrays have also been found. Such freestanding ZnO nanopropeller arrays were formed at relatively low temperature region (about 620° C. (step I)), and were apparently composed of hexagonal symmetrical arrays of ZnO triangular-shape blade of 20–500 nm in width and 4–5 μm in length.

Different from the triangular-shaped nanoblades presented in the sample grown in a lower temperature zone, nanoblades with uniform widths are found in a medium temperature zone (about 650° C. (step I)). In a higher temperature zone (about 680° C. (step I)), the nanoblades tended to be long and curved.

The top and bottom surfaces of the nanoblades had a different surface morphology. The steps are responsible for the increased blade thickness approaching the root. The bottom surface of the nanoblades is flat and much smoother. In one example, a broken blade revealed a trapezoid cross section, indicating that the side surface is not exactly [01$\bar{1}$0]. The shorter width side of the trapezoid corresponds to the stepped top surface, while the longer side to the flat bottom surfaces.

The growth of ZnO is dominated by the vapor-liquid-solid (VLS) process guided by the Sn catalyst and by the self-catalysis process. ZnO nanobelts have been grown without using catalyst, and ZnO can be self-catalytic active. Initially, the ZnO and $SnO_2$ powders were reduced by graphite and vaporized in the form of Zn, ZnO, Sn and O vapors. In a lower temperature zone, Sn vapor condensed onto the substrate, which lead to the growth of ZnO nanowires along [0001] and enclosed by [2$\bar{1}\bar{1}$0] surfaces. This was a fast growth process. Then, the Sn vapor condensed later on the surface of the nanowire lead to the epitaxial growth of ZnO nanobelts out of the surface of the nanowire, which extend along the six radial directions: ±[2$\bar{1}\bar{1}$0], ±[11$\bar{2}$0], ±[1$\bar{2}$10]. The nanoblades also grow transversely along [01$\bar{1}$0] as the growth proceeds along [2$\bar{1}\bar{1}$0], resulting in growth steps towards the tip. The later condensed Sn droplets on the surface of the nanoblades lead to the growth of secondary nanowires along c-axis, and this growth was along +c-axis rather than −c-axis due to higher catalytic activity of the Zn-terminated basal plane.

The growth morphology depends on the local temperature, surface diffusion rate and availability of Zn—O vapor. In a lower temperature region, where a relatively slower surface diffusion occurs and a decrease in supply of the vapor as more source material being consumed occurs, a triangular-shape structure is formed. On the other hand, a transverse growth along [10$\bar{1}$0] can extend the width of the nanoblades as the growth proceeds along [2$\bar{1}\bar{1}$0], resulting in the formation of triangular nanoribbon blades. In a medium temperature region, a faster diffusion of the Zn—O vapor and higher surface mobility may lead to the formation of uniform and longer nanoblades. By the same token, a faster growth along [2$\bar{1}\bar{1}$0] forms longer nanoblades in a higher temperature zone.

The c-plane of ZnO is a polar surface, with Zn-terminated [0001] and oxygen-terminated [000$\bar{1}$]. A recent study by the applicant found that the [0001]-Zn surface is chemically active in growing nanostructures, but the [000$\bar{1}$]-O surface appears to be inert. Therefore, further growth along [0001] is possible on the top surface of the nanoblade, resulting in secondary growth of nanowires as well as the formation of growth steps, but the [000$\bar{1}$]-O bottom surface is flat without growth although Sn particles may be deposited on the surface. The reason for the formation of the trapezoid shaped cross-section of the nanoblade (with shorter side on [0001]) and surface steps is likely due to a continuous growth along [0001], because the growth tends to reduce the area of the [0001] surface to decrease the surface energy due to polarization, resulting in a shrinkage in the width of the nanoblade along [0001]. Due to the piezoelectric property of ZnO, the structure could have applications for sensing, microfluidics, electromechnical coupled devices, and transducers.

In another embodiment of the invention, nanowire-based cantilevers offer a potential improvement to atomic force microscope (AFM) cantilevers. In one experiment conducted by the applicant, long ribbon-like nanostructures of semiconducting oxides and sulfides, such as, CdO, ZnO, $Ga_2O_3$, $PbO_2$, $In_2O_3$, $SnO_2$, and ZnS were synthesized. Nanobelt size and geometry were controlled during solid-state thermal evaporation processes without the aid of a catalyst. A CdO nanobelt was bent without fracture, indicating mechanical flexibility and toughness. The CdO nanobelts grew along the [100] or [010] directions, and can form zigzag shapes by switching the growth direction. Nanobelts range between 50 nm to 1 cm in length, 20 nm to 1 μm in width, and width to thickness ratios of about 9. Nanobelts are single crystals with specific oriented surfaces. The rectangular cross-section, uniform thickness, and ribbon (belt) like morphology make nanobelts is an ideal candidate for cantilever applications. Geometrically, nanobelts are significantly smaller than current cantilever technology and thus more sensitive to all detectable forces.

Nanobelts differ from conventional nanowires by being nearly void of dislocations and other line defects. A reduction in line defects increases the electronic and optoelectronic performance of a material. Also, nanobelts are wide band gap semiconductors, which are made from transparent conducting oxides for applications in optics, sensors, and functionalized surface coatings. Using the intrinsic semiconducting property of nanobelts, field effect transistors have been fabricated using individual nanobelts and demonstrated to exhibit interesting optoelectronic properties. Gas sensors have also been fabricated using single crystalline $SnO_2$ nanobelts. Electrical characterization showed that the contacts were ohmic and the nanobelts were sensitive to environmental polluting species like CO and $NO_2$ as well as ethanol for breath analyzers and food control applications. The results demonstrate the potential of fabricating nano-size sensors using the integrity of a single nanobelt with sensitivity at the level of a few ppb.

Manipulation of nanobelts is vital to the development and fabrication of nanoscale functional devices. Manipulation of ZnO nanobelts may occur via transmission electron microscopy (TEM) and atomic force microscopy (AFM). ZnO nanobelts have been sectioned at specified locations into various lengths using an atomic force probe. Exploiting the nearly ideal morphology of nanobelts, manipulation techniques may be used to form nanocantilevers. Nanobelt cantilevers are about 35 to 1,800 times smaller than conventional cantilevers. Sawing, fracturing, and lifting ZnO nanobelts are means for cantilever fabrication.

Integration of structurally controlled nanomaterials with microelectronic mechanical systems (MEMS) requires precise manipulation. The first task is to cut nanobelts into specific lengths. It is possible to cleave CdO nanobelts by a focused electron beam in a JEOL 100C transmission electron microscope. Additional techniques may be used to section nanobelts. The first method is to effectively saw through the nanobelt by: (1) increasing the aspect ratio of the viewing screen during AFM operation, (2) minimizing the scan size to capture only the width of a nanobelt, and (3) increasing the integral and proportional gains and thus increasing the applied force on the nanobelt during scanning. This technique can be used in either Tapping Mode or Contact Mode. The second method increases the force applied to the nanobelt while engaged in Force Calibration Mode of the SPM. This technique fractures nanobelts by driving the AFM silicon probe into their surface and is extremely reproducible. Fracturing of nanobelts is possible because the bond character is primarily ionic in nature, and thus an atomic displacement of half the lattice constant generates a cleavage due to Coulomb repulsion.

Tip contamination is a common annoyance in microscopy. However, when controlled, tip contamination becomes a critical tool for selectively picking up nanostructures and moving them from one substrate to another. Using a Dimension 3000 SPM in Tapping Mode, ZnO nanobelts may be lifted from a silicon substrate. Capillary forces are responsible for the adhesion strength between the atomic force microscope probe and the ZnO nanobelts.

Combining the aforementioned techniques with micromanipulation results in the horizontal alignment of individual ZnO nanobelts onto silicon chips. The aligned ZnO cantilevers may be manipulated to have a range of lengths. Thus, the resonance frequency of each cantilever may be tuned and cantilevers may thusly be modified for different applications, such as Contact, Non-Contact, and Tapping Mode AFM. Periodic contrast of the ZnO cantilevers occurs as a result of electronic charge induced vibrations during SEM operation. Such contrast is absent in regions where the nanobelts are in direct contact with the silicon substrate, suggesting adequate adhesion forces between the cantilevers and the silicon chip.

Figure 7:
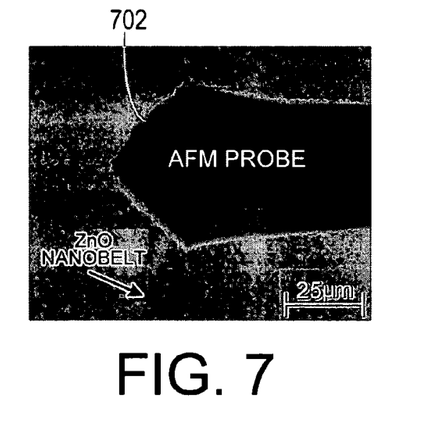
FIG. 7 is a side view micrograph of an atomic force microscope probe with a nanobelt tip extending therefrom.

Combining MEMS technology with self-assembled nanobelts results in the ability to produce cost effective cantilevers with heightened sensitivity for a range of devices and applications. Force, pressure, mass, thermal, biological, and chemical sensors are all prospective devices. Semiconducting nanobelts are ideal candidates for cantilever applications. Structurally they are defect free single crystals, providing excellent mechanical properties. The elastic modulus for a ZnO nanobelt has been measured by an in-situ TEM technique based on electromechanical resonance. Geometrically, the rectangular cross-section of nanobelts provides two distinctive resonant frequencies, corresponding to two orthogonal vibration directions. These opposing resonant frequencies can be exploited as alternative detection modes for many cantilever applications. Also, the reduced dimensions of nanobelt cantilevers offer a significant increase in cantilever sensitivity. Two approaches to transduction of an nanobelt cantilever include: quantitative measurement on the deflection of the nanobelt tip by optical or electron imaging techniques and piezoelectric effect across the ZnO nanobelt. A micrograph of an atomic force microscope cantilever probe 702 with a ZnO nanobelt tip is shown in FIG. 7.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:
1. A nanoscale junction array, comprising:
   a. an elongated nanowire; and
   b. a plurality of elongated nanobelts, each having a proximal end and an opposite distal end, the proximal end of each nanobelt being attached to a different location on the nanowire, each nanobelt extending radially away from the nanowire.

2. The nanoscale junction array of claim 1, wherein the elongated nanowire and the plurality of elongated nanobelts form a single crystal.

3. The nanoscale junction array of claim 1, wherein each nanobelt extends radially away from the nanowire to form a wurtzite hexagonal structure.

4. The nanoscale junction array of claim 3, wherein if the elongated nanowire is placed along a [0001] axis of a hexagonal coordinate scheme, then each of the plurality of elongated nanobelts will lie along an axis so as to have a symmetric orientation selected from a group comprising: ±[$\bar{1}010$], ±[$0\bar{1}10$], or ±[$\bar{1}\bar{1}20$].

5. The nanoscale junction array of claim 3, wherein if the elongated nanowire is placed along a [0001] axis of a hexagonal coordinate scheme, then each of the plurality of elongated nanobelts will lie along an axis so as to have a symmetric orientation selected from a group comprising: ±[$2\bar{1}\bar{1}0$], ±[$11\bar{2}0$], or ±[$1\bar{2}10$].

6. The nanoscale junction array of claim 1, wherein the proximal end of each nanobelt has a width of less than 100 nm and wherein the distal end of each nanobelt has a width in a range between 100 nm to 300 nm.

7. The nanoscale junction array of claim 1, wherein the distal end of each nanobelt has a width of less than 100 nm and wherein the proximal end of each nanobelt has a width in a range between 100 nm to 200 nm.

8. The nanoscale junction array of claim 1, wherein the elongated nanowire comprises zinc oxide.

9. The nanoscale junction array of claim 1, wherein each of the plurality of elongated nanobelts comprises zinc oxide.

10. The nanoscale junction array of claim 1, wherein the distal end of each of the plurality of elongated nanobelts terminates in a metal particle.

11. The nanoscale junction array of claim 10, wherein the metal particle comprises tin.

12. A nanopropeller, comprising:
 a. an elongated nanowire, having an elongated orientation; and
 b. a plurality of elongated nanoblades, each having a proximal end and an opposite distal end, the proximal end of each nanobelt being attached to a different location on the nanowire, each nanoblade extending radially away from the nanowire, each nanoblade having an elongated dimension terminated by the proximal end and the distal end with an elongated length between the proximal end and the distal end, a width dimension transverse to the elongated dimension and transverse to the elongated orientation of the elongated nanowire and having a length that is less than the elongated length, and a depth dimension having a length that is less than the length of the width dimension.

13. The nanopropeller of claim 12, wherein the width dimension of each nanoblade is greater at the proximal end that at the distal end.

14. The nanoscale junction array of claim 12, wherein if the elongated nanowire is placed along a [0001] axis of a hexagonal coordinate scheme, then each of the plurality of elongated nanoblades will lie along an axis so as to have a symmetric orientation selected from a group comprising: ±[$2\bar{1}\bar{1}0$], ±[$11\bar{2}0$], or ±[$1\bar{2}10$].

15. The nanoscale junction array of claim 12, wherein the distal end of each elongated nanoblade has a width of less than 100 nm and wherein the proximal end of each nanoblade has a width in a range between 100 nm to 200 nm.

16. The nanopropeller of claim 12, wherein the nanowire comprises a piezoelectric material that generates a voltage when the nanowire is twisted and further comprising:
 a. a first electrical contact in electrical communication with a first location on elongated nanowire;
 b. a second electrical contact in electrical communication with a second location on elongated nanowire, the second location being spaced apart from the first location and at least one nanoblade disposed between the first location and the second location; and
 c. a circuit that senses a voltage between the first electrical contact and the second electrical contact, the voltage being indicative of an amount of twist in the nanowire.

17. The nanopropeller of claim 16, wherein the nanopropeller is employed in a fluid flow detector and wherein the voltage indicates a rate of fluid flow.

18. The nanopropeller of claim 12, wherein the nanowire comprises a piezoelectric material that twists as a function of a voltage applied thereto and further comprising:
 a. a first electrical contact in electrical communication with a first location on elongated nanowire;
 b. a second electrical contact in electrical communication with a second location on elongated nanowire, the second location being spaced apart from the first location and at least one nanoblade disposed between the first location and the second location; and
 c. a circuit that generates a voltage between the first electrical contact and the second electrical contact, the voltage inducing twist in the nanowire, thereby inducing rotation of the nanoblades.

19. The nanopropeller of claim 18, wherein the nanopropeller is employed in a fluid propulsion system and wherein rotation of the blades causes movement of a fluid.

* * * * *